US007738976B2

(12) United States Patent
Saito

(10) Patent No.: US 7,738,976 B2
(45) Date of Patent: Jun. 15, 2010

(54) MONITORING METHOD OF PROCESSING STATE AND PROCESSING UNIT

(75) Inventor: Susumu Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 11/987,898

(22) Filed: Dec. 5, 2007

(65) Prior Publication Data

US 2008/0097627 A1  Apr. 24, 2008

Related U.S. Application Data

(62) Division of application No. 10/652,852, filed on Sep. 2, 2003, now Pat. No. 7,329,549.

(30) Foreign Application Priority Data

Sep. 2, 2002  (JP)  ............................ 2002-256745
Dec. 10, 2002  (JP)  ............................ 2002-358275

(51) Int. Cl.
*G05B 13/02* (2006.01)
(52) U.S. Cl. ........................................ 700/29; 700/121
(58) Field of Classification Search .................. 700/29, 700/108, 109, 121
See application file for complete search history.

(56) References Cited

U.S. PATENT DOCUMENTS

| 5,288,367 | A | 2/1994 | Angell et al. | ................. 216/60 |
| 5,658,423 | A | 8/1997 | Angell et al. | ................. 438/9 |
| 5,866,917 | A | 2/1999 | Suzuki et al. | .......... 250/559.27 |
| 5,989,928 | A | 11/1999 | Nakata et al. | ................. 438/7 |
| 6,153,115 | A | 11/2000 | Le et al. | ....................... 216/60 |
| 6,498,045 | B1 | 12/2002 | Gu | ................................ 438/9 |
| 6,521,080 | B2 | 2/2003 | Balasubramhanya et al. | ..... 156/345.24 |
| 6,559,942 | B2 | 5/2003 | Sui et al. | ................... 356/369 |
| 6,586,262 | B1 | 7/2003 | Saito et al. | ..................... 438/9 |
| 6,759,253 | B2 | 7/2004 | Usui et al. | ..................... 438/6 |
| 6,879,867 | B2 | 4/2005 | Tanaka et al. | ............... 700/108 |
| 6,890,771 | B2 | 5/2005 | Kaji et al. | ....................... 438/9 |

(Continued)

FOREIGN PATENT DOCUMENTS

JP  2000-331985  11/2000

(Continued)

*Primary Examiner*—Albert DeCady
*Assistant Examiner*—Chad Rapp
(74) *Attorney, Agent, or Firm*—Smith, Gambrell & Russell, LLP

(57) ABSTRACT

The present invention is a monitoring method of monitoring a change of a processing state of an object to be processed when a predetermined process is conducted to the object to be processed by using a processing unit. The method includes: a step of respectively setting constant response variables for two states before and after a processing state changes, the response variables being different from each other; and a step of conducting a multiple regression analysis about the response variables in order to produce a model expression, predictor variables of the multiple regression analysis being a plurality of detected data from a plurality of detectors provided in the processing unit. Then, the method includes: a step of actually obtaining a plurality of detected data from the plurality of detectors when the predetermined process is conducted to the object to be processed; and a step of estimating or monitoring a processing state by applying the obtained plurality of detected data to the model expression.

2 Claims, 8 Drawing Sheets

U.S. PATENT DOCUMENTS

| | | | |
|---|---|---|---|
| 6,908,529 B2 | 6/2005 | Yamamoto et al. | 156/345.24 |
| 6,985,215 B2 | 1/2006 | Oh et al. | 356/72 |
| 7,062,417 B2 * | 6/2006 | Kruger et al. | 703/2 |
| 7,067,333 B1 | 6/2006 | Pasadyn et al. | 438/5 |
| 2003/0046976 A1 | 3/2003 | Hanazaki et al. | 73/23.21 |
| 2003/0058909 A1 | 3/2003 | Benyon | 372/43.01 |
| 2003/0098290 A1 | 5/2003 | Kaji et al. | 216/61 |
| 2003/0170984 A1 | 9/2003 | Yamamoto et al. | 438/689 |
| 2003/0190761 A1 | 10/2003 | Oluseyi | 438/7 |
| 2003/0235997 A1 | 12/2003 | Lee et al. | 438/745 |
| 2004/0023403 A1 | 2/2004 | Tatsunari | 436/144 |
| 2004/0060659 A1 | 4/2004 | Morioka et al. | 156/345.26 |
| 2005/0125090 A1 | 6/2005 | Sakano et al. | 700/108 |

FOREIGN PATENT DOCUMENTS

| | | |
|---|---|---|
| JP | 2001-60585 | 3/2001 |

* cited by examiner

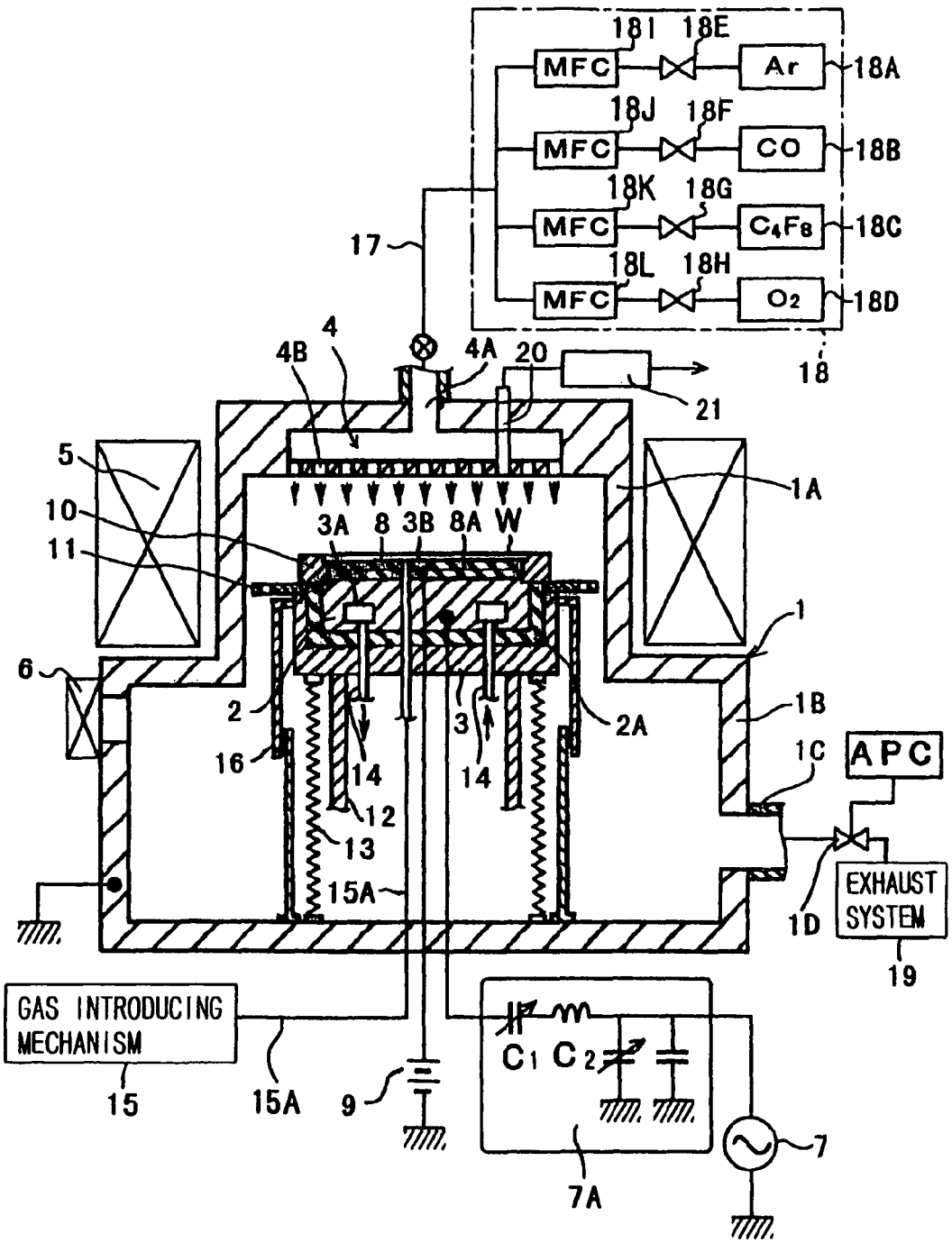
F I G. 1

MONITORING METHOD OF PROCESSING STATE AND PROCESSING UNIT

CROSS REFERENCE TO RELATED APPLICATION

This application is a division of Ser. No. 10/652,852, filed Sep. 2, 2003 now U.S. Pat. No. 7,329,549, and is being incorporated in its entirety herein by reference.

FIELD OF THE INVENTION

This invention relates to a monitoring method of a process (processing state) and a processing unit. More concretely, this invention relates to a monitoring method of a process and a processing unit which can surely monitor a change of a processing state such as an etching state.

BACKGROUND ART

An etching method using plasma has been prevailingly applied to a semiconductor device manufacturing step or a LCD substrate manufacturing step. For example, an etching unit comprises an upper electrode and a lower electrode, which are arranged in parallel to each other. Under a condition wherein an object to be processed (for example, a semiconductor wafer) is placed on the lower electrode, plasma is generated from an etching gas by means of discharge between the upper electrode and the lower electrode, so that the semiconductor wafer is etched in accordance with a predetermined pattern.

An instrumental analysis method, such as a mass analysis method or an emission spectral analysis method, is used as a method of detecting an end point of the etching process. Among them, an emission spectral analysis method for the plasma, which is relatively simple and sensitive, is widely used as the end-point detecting method. According to an emission measuring method of the plasma using an emission spectral analysis method, a particular activated species capable of most easily monitored is selected from radicals and ions of the etching gas, decomposition products thereof, reaction products thereof, and so on. Then, an emission intensity of a specific wavelength corresponding to the selected activated species is measured. For example, when a silicon oxide film is etched by using a CF-series etching gas such as $CF_4$, an emission intensity of a specific wavelength of $CO^*$ that is the reaction product (483.5 nm or the like) is detected. When a silicon nitride film is etched by using a CF-series etching gas such as $CF_4$, an emission intensity of a specific wavelength of $N^*$ that is the reaction product (674 nm or the like) is detected. Then, the end point is detected based on one or more changing points of the detected intensity. That is, according to the conventional end-point detecting method, the wavelength used in the end-point detecting method may be different depending on each etching process.

As described above, according to the conventional end-point detecting method, only a specific wavelength among the emission spectrum of the plasma is monitored to detect the end point. Thus, it is difficult to detect the end point when the change of the emission intensity of the specific wavelength is so small that it is difficult to detect a sufficient change of the emission intensity, for example when an etching process is conducted under a small aperture condition.

U.S. Pat. No. 5,288,367 discloses a method of detecting an end point, wherein a specific wavelength of the emission spectrum is automatically determined by means of a principal component analysis and then the end point is detected based on the specific wavelength. According to the method, the specific wavelength to be used is automatically determined. However, the point that a specific wavelength is used to detect an end point is not different from the conventional end-point detecting method.

The applicant has proposed another method of detecting an end point, wherein a first principal component score about emission intensities of component wavelengths of the plasma is obtained by means of a principal component analysis and then the end point is detected based on a change with time of the first principal component score (Japanese Patent Laid-Open Publication No. 2000-331985). For example, FIG. 9 is a graph showing a change with time of a first principal component score of a component wavelength in a wavelength region of 210 to 410 nm. In the case, a change from a pre-etching state to a post-etching (over-etching) state, that is, an end point of the etching process can be clearly judged. However, if a resist with a much low aperture ratio (for example of 0.25%) is used for the same wafer, a change with time of the above first principal component score becomes as shown in FIG. 10. In the case, the noise is so much that it is difficult to detect the end point.

SUMMARY OF THE INVENTION

This invention is intended to solve the above problems. The object of this invention is to provide a monitoring method of a process and a processing unit which can surely detect a change of a processing state, even when the change of a processing state is small, for example a change of emission intensity of plasma during an etching process conducted under a small aperture condition.

This invention is a monitoring method of monitoring a change of a processing state of an object to be processed when a predetermined process is conducted to the object to be processed by using a processing unit, the monitoring method comprising: a step of respectively setting constant response variables for two states before and after a processing state changes, the response variables being different from each other; a step of conducting a multiple regression analysis about the response variables in order to produce a model expression, predictor variables of the multiple regression analysis being a plurality of detected data from a plurality of detectors provided in the processing unit; a step of actually obtaining a plurality of detected data from the plurality of detectors when the predetermined process is conducted to the object to be processed; and a step of estimating or monitoring a processing state by applying the obtained plurality of detected data to the model expression.

According to the feature, a change of a processing state, even when the change of a processing state is small, for example a change of emission intensity of plasma during an etching process conducted under a small aperture condition, can be surely detected.

For example, the processing unit is a plasma processing unit. In the case, for example, the plurality of detected data is emission intensities of a plurality of component wavelengths of plasma. Preferably, the emission intensities of a plurality of component wavelengths of plasma change depending on the two states.

In addition, for example, the two states are a state on the way of an etching process and a state after a completion of the etching process.

In addition, this invention is a processing unit for conducting a predetermined process to an object to be processed, the processing unit comprising: a plurality of detectors; and a controlling unit that estimates or monitors a processing state based on a plurality of detected data from the plurality of detectors; wherein the controlling unit includes: a first storage unit that stores the plurality of detected data; a second storage unit that stores constant response variables respectively set for two states before and after the processing state changes, the response variables being different from each other; a third storage unit that stores a multivariate analysis program, according to which a multiple regression analysis about the response variables is conducted in order to produce a model expression, predictor variables of the multiple regression analysis being the plurality of detected data; a first computing unit that executes the multivariate analysis program to produce the model expression; a fourth storage unit that stores the produced model expression; a second computing unit that applies the plurality of detected data to the model expression in order to estimate or monitor the processing state, the plurality of detected data being detected when the predetermined process is conducted to the object to be processed.

According to the feature, a change of a processing state, even when the change of a processing state is small, for example a change of emission intensity of plasma during an etching process conducted under a small aperture condition, can be surely detected.

For example, the processing unit is a plasma processing unit. In the case, for example, the plurality of detectors is optical detectors that detect emission intensities of a plurality of component wavelengths of plasma.

BRIEF DESCRIPTION OF THE DRAWINGS

FIG. 1 is a schematic view showing a plasma processing unit that is an embodiment of a processing unit of the present invention;

DESCRIPTION OF THE PREFERRED EMBODIMENT

Figure 2:
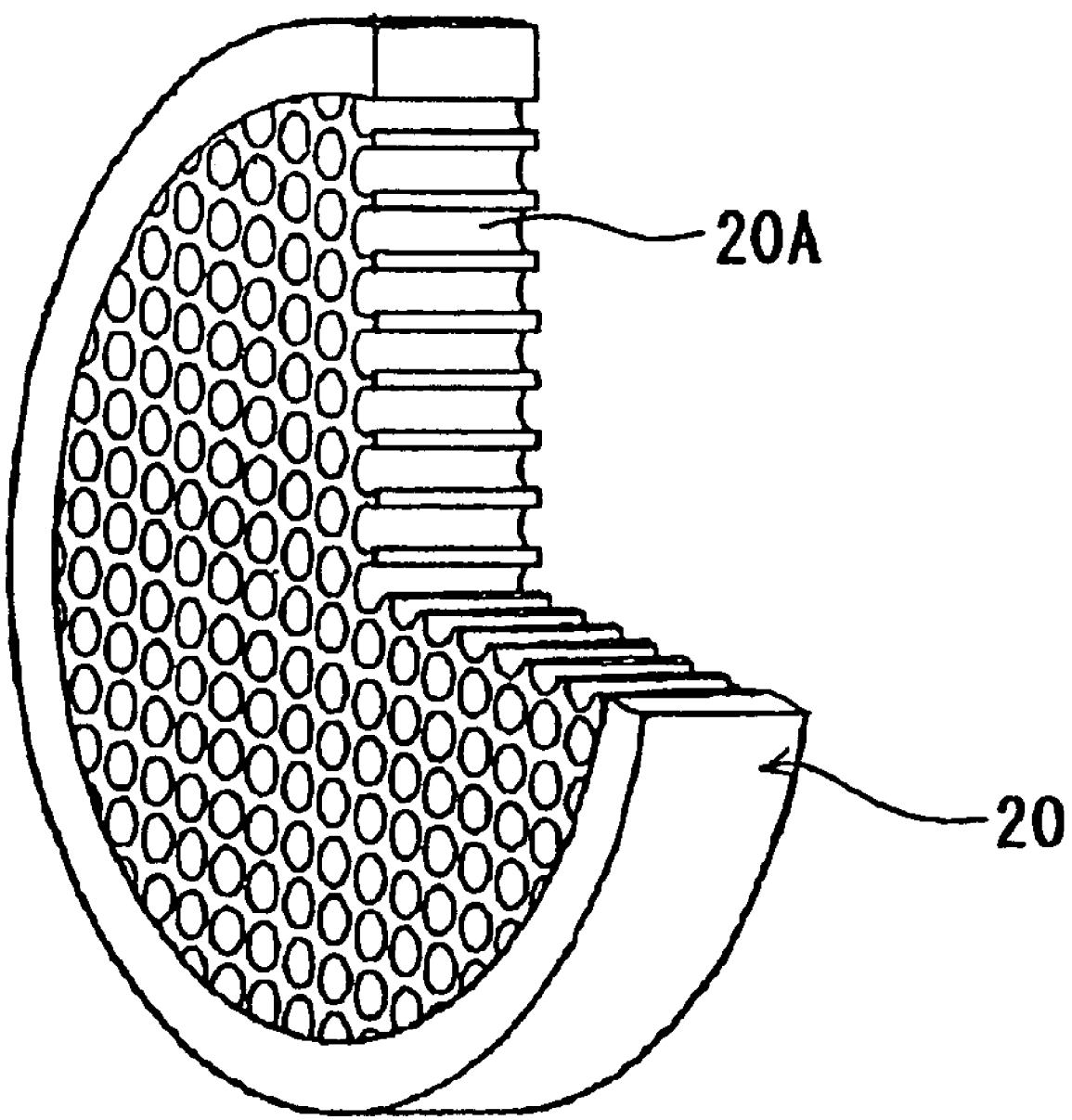
FIG. 2 is a perspective view of an example of collimator used in the plasma processing unit shown in FIG. 1, which is locally broken away.

Hereinafter, the present invention is explained based on an embodiment shown in FIGS. 1 to 8.

At first, a plasma processing unit, which is an embodiment of a processing unit of the present invention, is explained. As shown in FIG. 1, for example, the plasma processing unit of the embodiment comprises: a chamber 1 made of aluminum; a supporting body 3 made of aluminum, supporting a lower electrode 2 arranged in the chamber 1 via an insulating member 2A, and capable of being moved upward and downward; and a showerhead 4 (that can be also referred to as "upper electrode", if requested) arranged above the supporting body 3, capable of supplying a process gas and serving as an upper electrode. An etching process is adapted to be conducted to a wafer W above the supporting body 3 by means of plasma generated between the lower electrode 2 and the showerhead 4.

An upper portion of the chamber 1 is formed as an upper room 1A having a smaller diameter. A lower portion of the chamber 1 is formed as a lower room 1B having a larger diameter. The upper room 1A is surrounded by a dipole annular magnet 5. The dipole ring magnet 5 is formed by a plurality of anisotropic segment columnar magnets, each of which is rotatably contained in a casing made of annular magnetic material. Thus, a uniform horizontal rotating magnetic field, which is directed toward one direction as a whole, is formed in the upper room 1A. A gate through which the wafer W is conveyed is formed at an upper portion of the lower room 1B. A gate valve 6 is mounted on the gate. In addition, a high-frequency electric power source 7 is connected to the lower electrode 2 via a matching unit 7A. The high-frequency electric power source 7 applies a high-frequency electric power P of 13.56 MHz to the lower electrode 2. Thus, an electric field in the perpendicular direction is formed between the lower electrode 2 and the upper electrode 4 in the upper room 1A.

An electrostatic chuck 8 is arranged in the upper surface of the lower electrode 2. A direct-current electric power source 9 is connected to an electrode plate 8A of the electrostatic chuck 8. Thus, when a high voltage is applied from the direct-current electric power source 9 to the electrode plate 8A under a high vacuum, the wafer W is electrostatically stuck to the electrostatic chuck 8. A focus ring 10 is arranged on an outer circumference of the lower electrode 2. Thus, the plasma generated in the upper room 1A is focused on the wafer W. An exhaust ring 11 is located under the focus ring 10 and mounted on an upper portion of the supporting body 3. A plurality of holes is formed in the exhaust ring 11 at regular intervals in a whole circumferential direction thereof. Through the holes, the gas in the upper room 1A is discharged to the lower room 1B.

The supporting body 3 is capable of being moved upward and downward in the upper room 1A and the lower room 1B via a ball screw mechanism 12 and a bellows 13. Thus, when a wafer W is supplied onto the lower electrode 2, the lower electrode 2 is moved down into the lower room 1B via the supporting body 3, the gate valve 6 is opened, and the wafer W is supplied onto the lower electrode 2 by means of a conveying mechanism not shown. A distance between the lower electrode 2 and the upper electrode 4 is set to a predetermined value. In addition, a refrigerant way 3A, which is connected to a refrigerant pipe 14, is formed in the supporting body 3. A refrigerant circulates in the refrigerant way 3A via the refrigerant pipe 14. Thus, the wafer W is adjusted to a predetermined temperature. In addition, gas ways 3B are formed in the supporting body 3, the insulating member 2A, the lower electrode 2 and the electrostatic chuck 8, respectively. Thus, He gas can be supplied as a backside gas by a predetermined pressure from a gas introducing mechanism 15 to a thin gap between the electrostatic chuck 8 and the wafer W via a gas pipe 15A. By means of the He gas, thermal conductivity between the electrostatic chuck 8 and the wafer W can be enhanced. Herein, a numeric sign 16 represents a bellows cover.

A gas introducing part 4A is formed in the upper surface of the showerhead 4. A process-gas supplying system 18 is connected to the gas introducing part 4A via a pipe 17. The process-gas supplying system 18 includes an Ar-gas supplying source 18A, a Co-gas supplying source 18B, a $C_4F_8$-gas supplying source 18C and an $O_2$-gas supplying source 18D. The respective gas supplying sources 18A, 18B, 18C and 18D supply the respective gases into the showerhead 4 at predetermined flow rates via valves 18E, 18F, 18G and 18H and massflow controllers 18I, 18J, 18K and 18L. Thus, a mixed gas having a predetermined compounding ratio can be adjusted in the showerhead 4.

A plurality of holes 4B is arranged uniformly in the whole lower surface of the showerhead 4. The mixed gas is supplied as a process gas from the showerhead 4 into the upper room 1A via the holes 4B. An exhaust hole at a lower portion of the lower room 1B is connected to an exhaust pipe 1C. The chamber 1 is exhausted by an exhaust system 19 consisting of a vacuum pump or the like connected to the exhaust pipe 1C, so that a predetermined gas pressure is maintained in the chamber 1. An APC valve 1D is provided in the exhaust pipe 1C. The open degree of the APC valve 1D can be automatically adjusted depending on the gas pressure in the chamber 1.

For example, an optical measuring instrument 21, which detects many wavelengths of plasma emission in the chamber 1 via a collimator 20, is provided at a side wall of the upper room 1A. Based on emission intensities (detected data) measured by the optical measuring instrument 21, the plasma state is monitored so that an end point of the etching process is detected.

For example, as shown in FIG. 2, the collimator 20 is formed by binding a plurality of capillaries made of glass, each of which has an inside diameter of 6 μm and a length of 1 mm. Thus, the collimator 20 has a disklike shape having a large number of holes 20A uniformly in the whole surface thereof. The collimator 20 is arranged between a lens at a tip end of an optical fiber and the chamber 1. When the collimator 20 is used, a reflected light from the surface of the wafer W can be blocked. Thus, effect of interference light by a resist film on the surface of the wafer W can be inhibited, so that noise of the emission intensities of component wavelengths of the plasma can be reduced to ⅓. In addition, emission from plasma sheaths, which are formed in vicinity of the respective surfaces of the upper and lower electrodes 2, 4, is blocked, so that only a parallel light from a bulk portion of the plasma can be received so as to reduce the noise further more.

Figure 3:
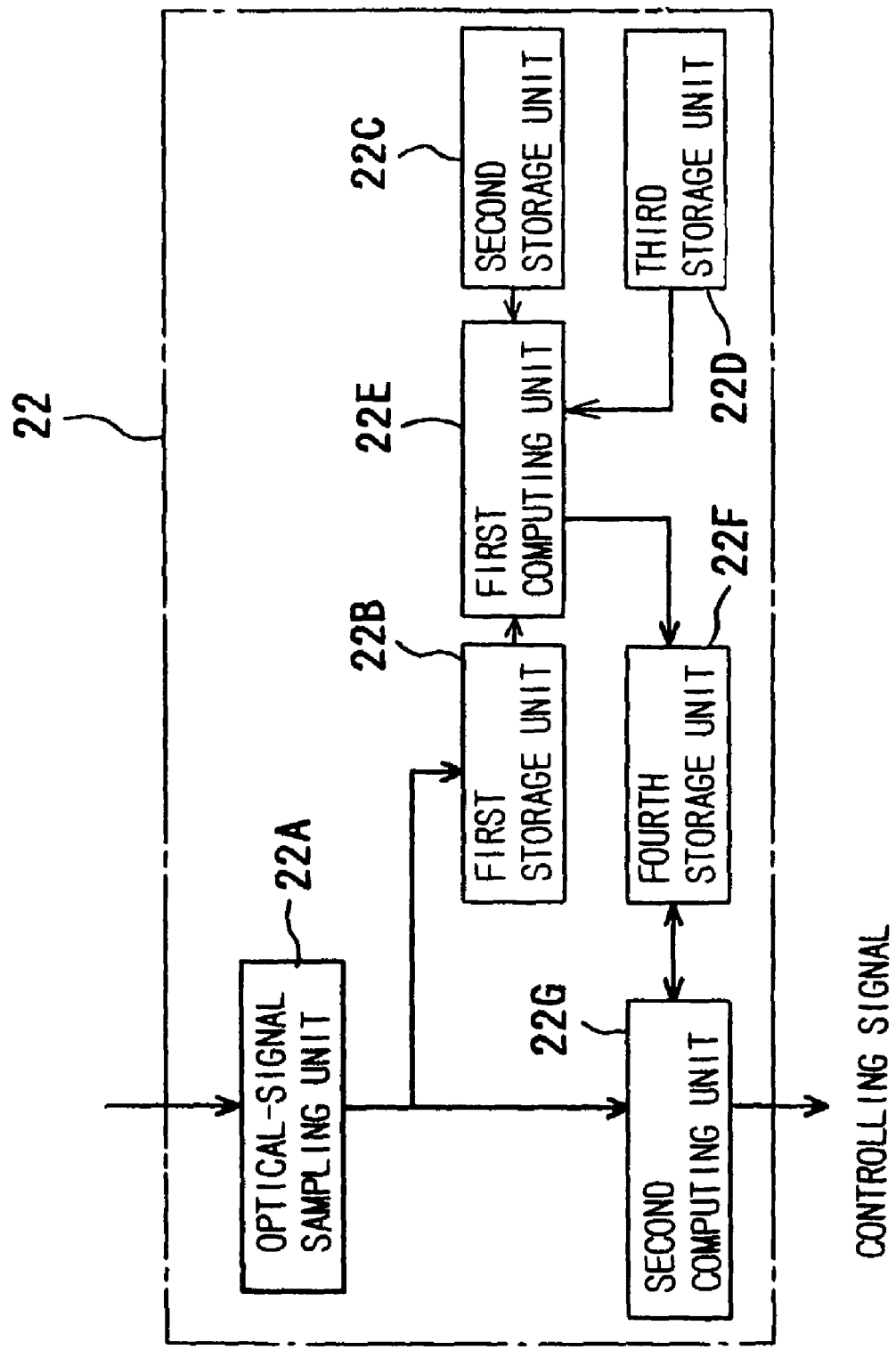
FIG. 3 is a block diagram showing a part of a controlling unit in the plasma processing unit shown in FIG. 1.

Then, in the embodiment, the detected date from the optical measuring instrument 21 are subjected to a multiple regression analysis by using a multivariate analysis program registered in a controlling unit 22, so that an end point of the etching process is detected. For example, as shown in FIG. 3, the controlling unit 22 comprises: an optical-signal sampling unit 22A that samples the detected data of the emission intensities of the component wavelengths of the plasma from the optical measuring instrument 21 as detected signals; a first storage unit 22B that stores the detected signals from the optical-signal sampling unit 22A; a second storage unit 22C that stores constant response variables respectively set for two states before and after the etching process, the response variables being different from each other; a third storage unit 22D that stores a multivariate analysis program, according to which a multiple regression analysis, a principal component analysis or the like about the response variables is conducted, predictor variables of the multiple regression analysis, the principal component analysis or the like being the plurality of detected data; a first computing unit 22E that conducts the multiple regression analysis based on the response variables, the predictor variables and the multivariate analysis program to produce a model expression; a fourth storage unit 22F that stores the produced model expression of the multiple regression analysis; and a second computing unit 22G that applies a plurality of detected data to the model expression as the predictor variables in order to obtain response variables, the plurality of detected data being detected when the predetermined process is conducted to the wafer W. Based on change of the response variables, the controlling unit 22 is adapted to monitor the process. The first and second computing units 22E and 22G can be contained in one CPU. In addition, the first, second, third and fourth storage units 22B, 22C, 22D and 22F can be contained in one storage unit.

Figure 4:
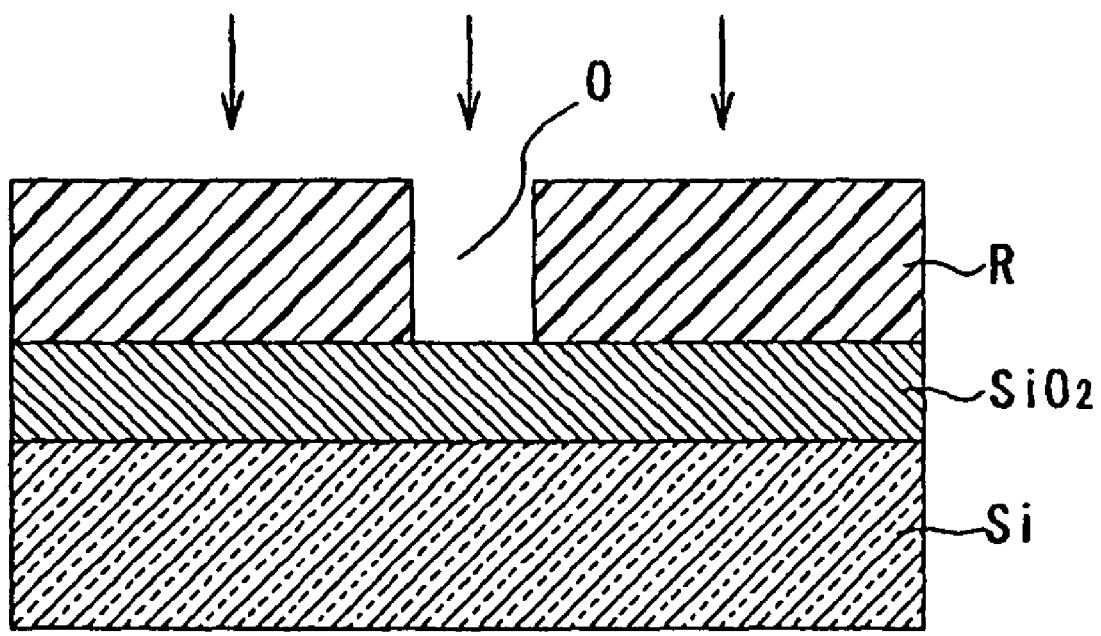
FIG. 4 is a sectional view showing a part of a wafer to be etched by using the plasma processing unit shown in FIG. 1.

In the embodiment, for example, a wafer W as shown in FIG. 4 is etched, and a multiple regression analysis is conducted by the controlling unit 22 based on detected data from the optical measuring instrument 21. As shown in FIG. 4, the wafer W has: a silicon layer Si; a thermal oxide film $SiO_2$ layered on the silicon layer Si; and a resist layer R layered on the thermal oxide film $SiO_2$. One or more openings O having an aperture ratio of 0.25% are formed in the resist layer R. The plasma is emitted through the openings O, so that the thermal oxide film $SiO_2$ is etched until the silicon layer Si appears.

Figure 5:
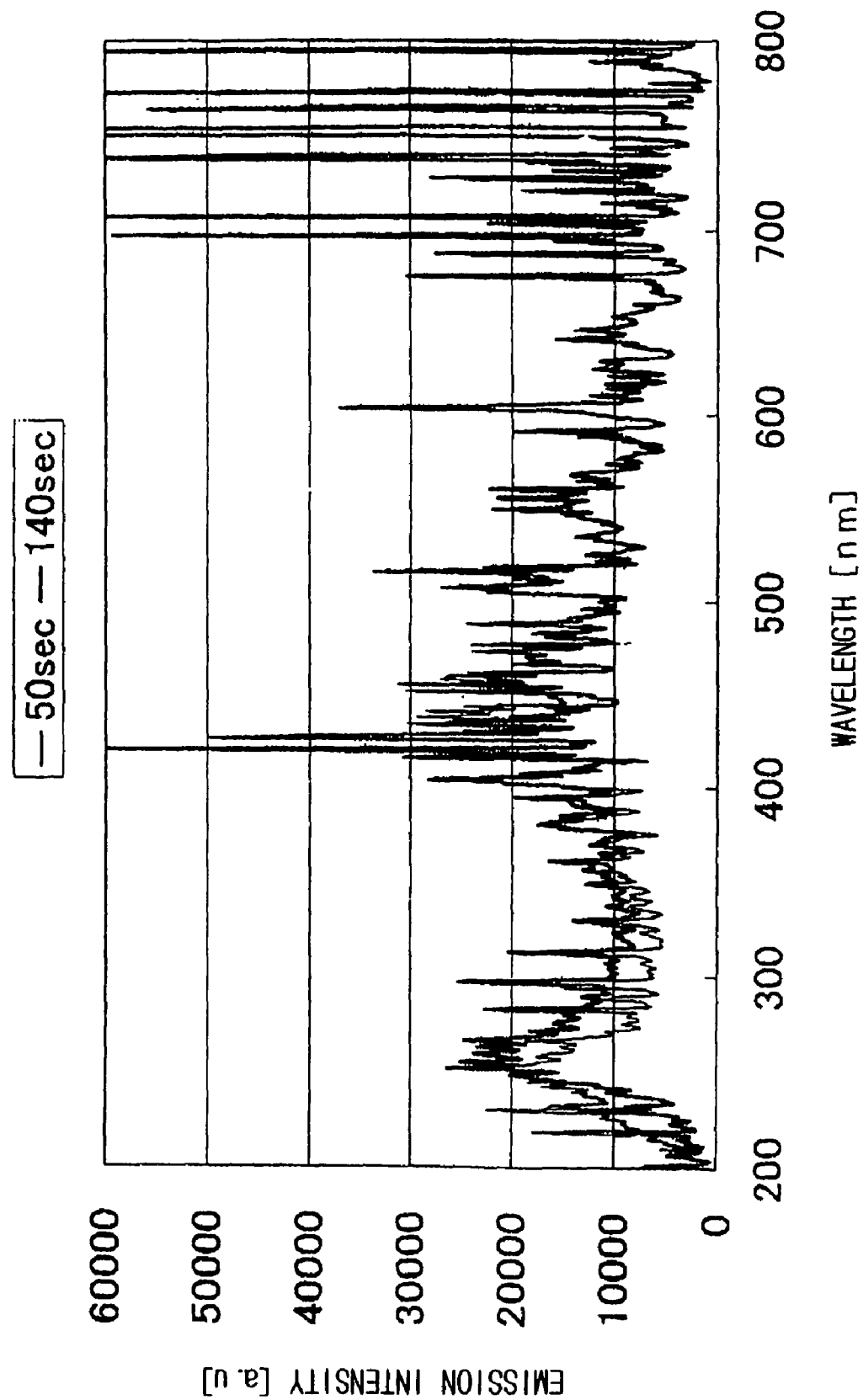
FIG. 5 is a graph showing an emission spectrum of plasma when a wafer having a solid (fully covering) oxide film is etched.

When the wafer W is etched by using the above plasma processing unit, an emission spectrum as shown in FIG. 5 is obtained from the optical measuring instrument 21. That is, an emission spectrum shown by a chain line is obtained at a time of 50 seconds before the completion of the etching process (on the way of the etching process). On the other hand, an emission spectrum shown by a solid line is obtained at a time of 140 seconds after the completion of the etching process (over etching). As clearly seen from FIG. 5, in a wavelength region of 200 nm to 450 nm, emission intensities of component wavelengths of the emission spectrums are different between before and after the etching process. However, in a wavelength region over 450 nm, emission intensities of the emission spectrums are hardly different between before and after the etching process.

Thus, in the embodiment, a plurality of component wavelengths in a wavelength region of 210 nm to 410 nm, in which the emission intensities are different between before and after the etching process, is used as the component wavelengths for detecting the end point of the etching process. Herein, respective emission intensities of component wavelengths every 0.5 nm in the wavelength region are detected, and values thereof are used as detected data. When the emission intensities are detected, the dipole annular magnet 5 rotates once in 3.1 seconds, and the optical measuring instrument 21 measures the plasma thirty-one times during that rotation. That is, the emission intensities of the plasma are measured ten times in one second. Then, averages of the emission intensities of the respective component wavelengths, which intensities change during the measurement of one rotation, are used as the detected data.

Then, in the embodiment, before the real wafer W is etched, a sample wafer (a wafer having a solid oxide film) is used and a multiple regression analysis is conducted to the emission intensities of the respective component wavelengths in the above wavelength region. Emission intensities (averages) of the respective component wavelengths by an i-th measurement are set as predictor variables $x_{ij}$, and response variables $y_i$, which respectively represent the two states before and after the etching process, are set to be respective optional values. Then, the multiple regression analysis is conducted to produce a multiple-regression model expression as shown by the following expression (1). In the following expression (1), if emission intensities of component wavelengths in which the emission intensities is not different between before and after the etching process are set as $x_{i1}$; emission intensities of component wavelengths in which the emission intensities increase (are higher) after the etching process are set as $x_{i2}$; and emission intensities of component wavelengths in which the emission intensities decrease (are lower) after the etching process are set as $x_{i3}$; a multiple regression coefficient $A_{i1}$ of the emission intensities $x_{i1}$ represents a value near to "0", a multiple regression coefficient $A_{i2}$ of the emission intensities $x_{i2}$ represents a positive great value and a multiple regression coefficient $A_{i3}$ of the emission intensities $X_{i3}$ represents a negative great value. Thus, the multiple regression coefficient $A_{i1}$ hardly contributes to the detection of the end point of the etching process, that is, weight thereof is very small, while the multiple regression coefficients $A_{i2}$ and $A_{i3}$ greatly contribute to the detection of the end point of the etching process, that is, weights thereof are large. In addition, in the following expression (1), "i" represents an i-th measurement, and "n" represents the total number of the used component wavelengths.

$$y_i = A_{i1}x_{i1} + A_{i2}x_{i2} + A_{i3}x_{i3} + \ldots + A_{in}x_{in} + B_i \quad (1)$$

In the embodiment, regarding the response variables representing the two states before and after the etching process, a theoretical value of the response variable representing the state before the etching process is set to be "1", while a theoretical value of the response variable representing the over etching state after the etching process is set to be "3". When theoretical values of the response variables $y_i$ are set as described above, observed values $y_i$ of the response variable fluctuate around "1" before the etching process, while observed values $y_i$ of the response variable fluctuate around "3" after the etching process.

A plurality of measurements is conducted by the completion of the etching process. The following expression (2) as a multiple-regression model expression is obtained by integrating the above multiple-regression model expressions (1) by the plurality of measurements. In the following expression (2), Y represents a matrix of response variables in the plurality of measurements, A represents a regression matrix of multiple regression coefficients, X represents a matrix of predictor variables, and B represents a matrix of residuals. The regression matrix A of the multiple-regression model expression can be obtained by using a PLS method. The details of the PLS method is disclosed in JOURNAL OF CHEMOMETRICS, VOL. 2 (PP. 211-228) (1998), for example.

$$Y = AX + B \quad (2)$$

Figure 6:
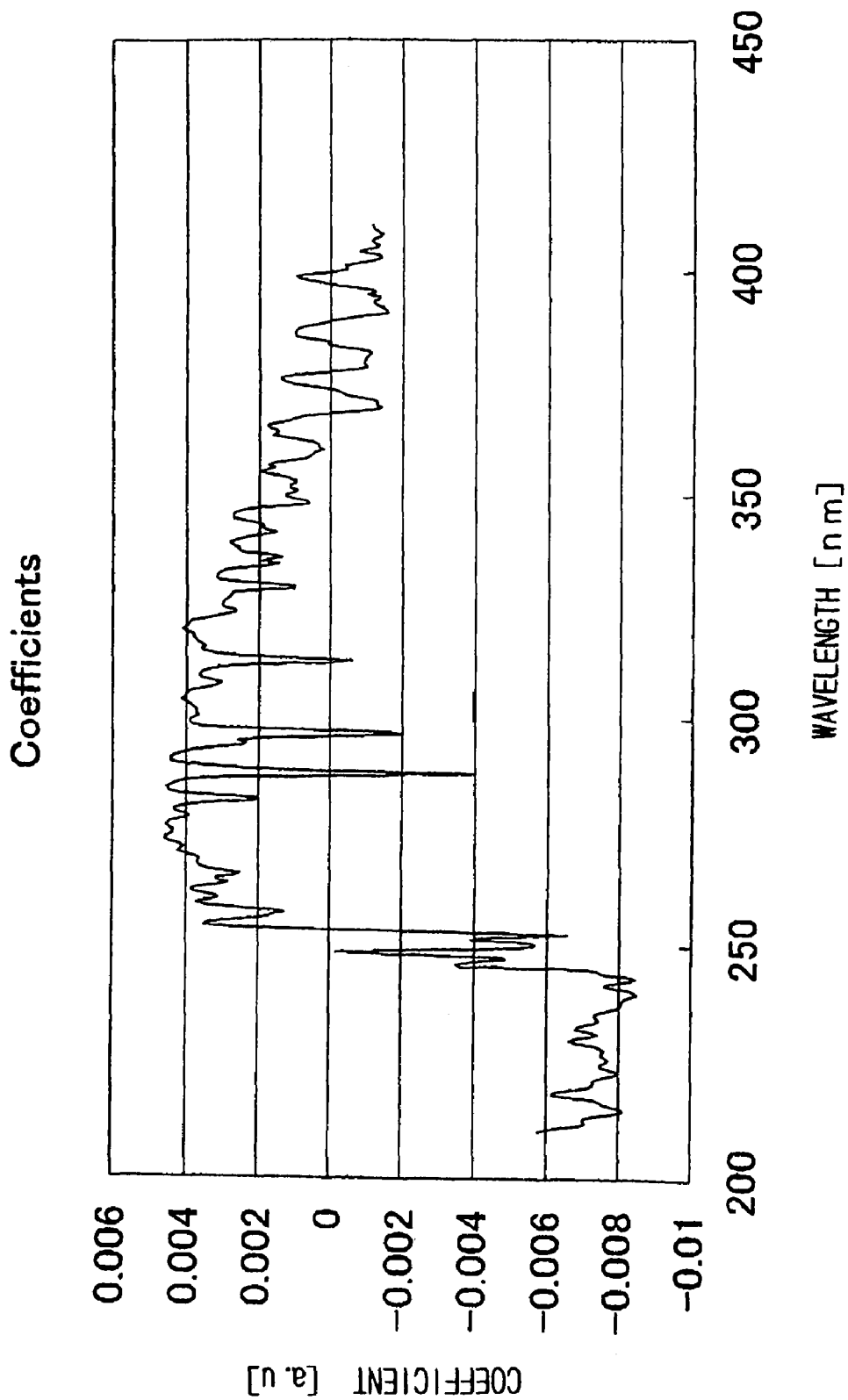
FIG. 6 is a graph showing multiple regression coefficients of respective component wavelengths, which are obtained through a multiple regression analysis of emission intensities of the component wavelengths of the emission spectrum shown in FIG. 5.

Coefficients of emission intensities of a plurality of component wavelengths in the wavelength region of 210 ram to 410 ram of an emission spectrum of the sample wafer are obtained by the above method, and shown in FIG. 6. As clearly seen from FIG. 6, the emission intensities of the component wavelengths in the wavelength region of 210 nm to 410 nm greatly fluctuate in positive and negative directions. Thus, it can be seen that the respective component wavelengths have large weights for detecting the end point of the etching process.

Figure 7:
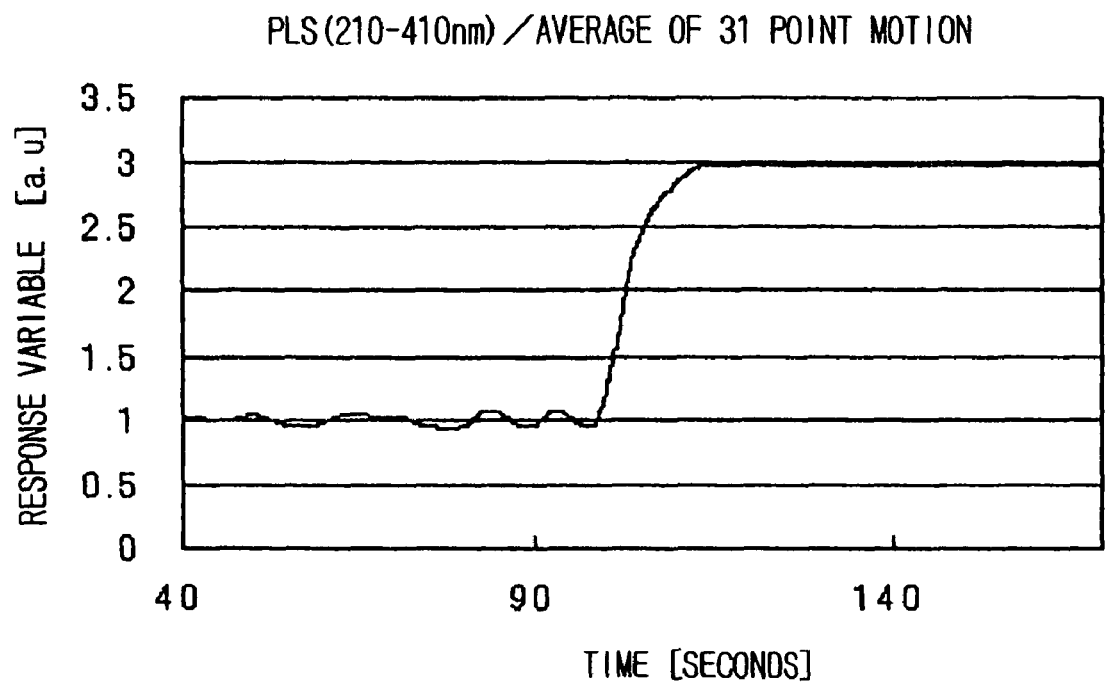
FIG. 7 is a graph showing a change with time of a response variable, which is obtained through a multiple regression analysis of emission intensities of the component wavelengths of the emission spectrum shown in FIG. 5.

Regarding a case wherein theoretical values of response variables representing states before and after the etching process are set to be "1" and "3", respectively, response variables $y_i$ based on the emission intensities $x_{ij}$ of the respective component wavelengths of the emission spectrum during the etching process to the sample wafer are shown in FIG. 7. As clearly seen from FIG. 7, in the embodiment, a change of the emission spectrum by the etching process is observed by means of the emission intensities of the plurality of component wavelengths, so that the change from the pre-etching state to the post-etching state can be judged clearly. That is, the end point of the etching process can be surely determined (detected).

Figure 8:
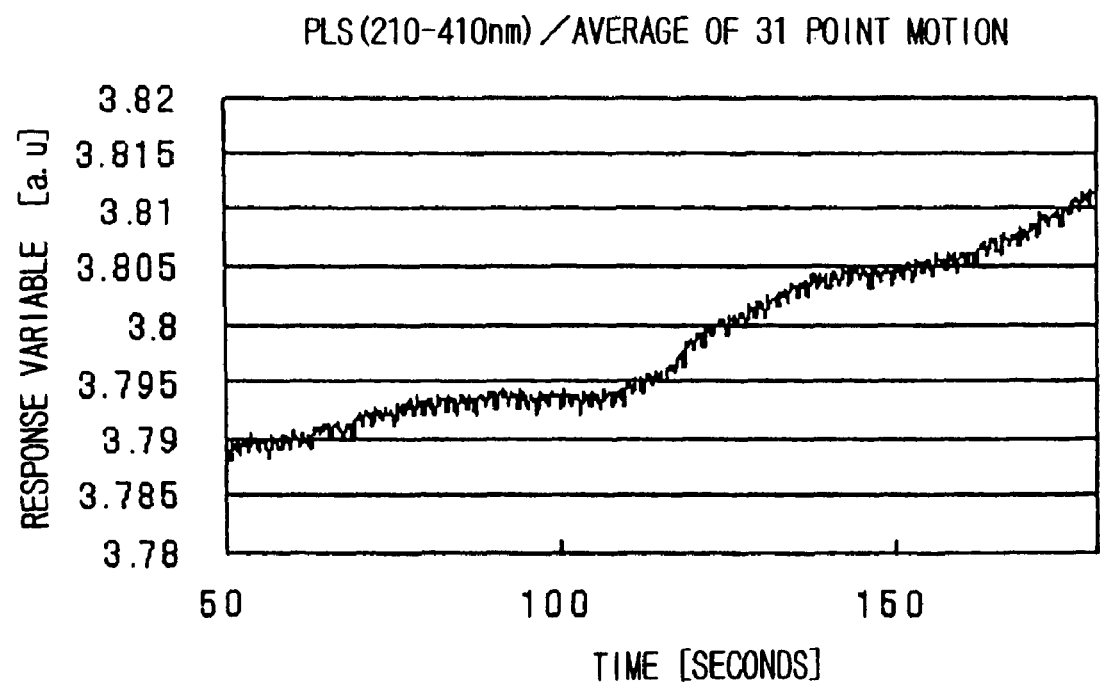
FIG. 8 is a graph showing a change with time of a response variable, which is obtained through a multiple regression analysis of emission intensities of the component wavelengths when the small-aperture wafer shown in FIG. 4 is etched.
Figure 9:
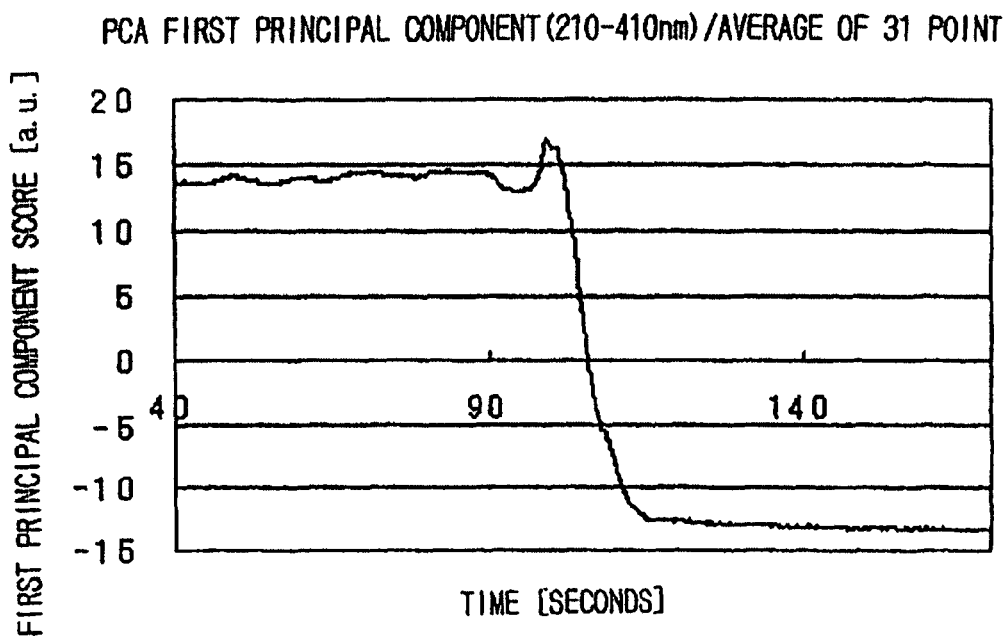
FIG. 9 is a graph showing a change with time of a first principle component score, which is obtained through a principle component analysis of emission intensities of the component wavelengths of the emission spectrum shown in FIG. 5.
Figure 10:
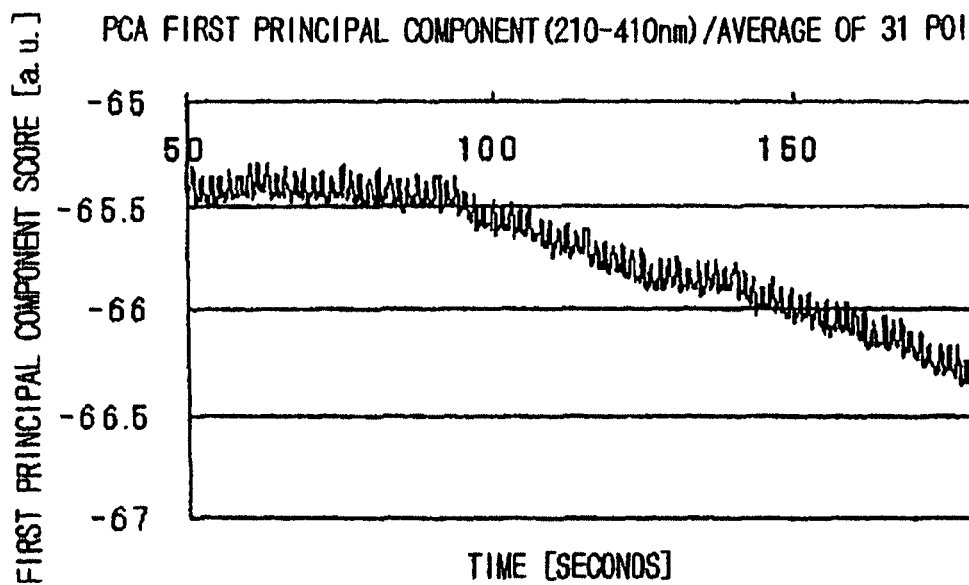
FIG. 10 is a graph of prior art showing a change with time of a first principle component score, which is obtained through a principle component analysis of emission intensities of the component wavelengths when the small-aperture wafer shown in FIG. 4 is etched.

Next, regarding a case wherein a wafer having a low aperture rate (0.25%) is etched, a change of the response variable is checked by applying emission intensities of respective component wavelengths to the predictor variables of the multi-regression model expression (1) obtained by using the sample wafer. The result is shown in FIG. 8. As seen clearly from the result of FIG. 8, the response variable increases similarly to the graph shown in FIG. 7, even if the wafer has the low aperture rate. That is, similarly to the sample wafer, the end point of the etching process can be detected. Compared with the conventional case shown in FIG. 10, noise of the response variable is smaller, so that the end point of the etching process can be detected more easily. Differently from the result of FIG. 7, in the result of FIG. 8, the response variable doesn't change from "1" to "3" between before and after the etching process. The response variable on the way of the etching process is greater than "1" and the gap to the response variable of the over etching state is small. The reason can be thought that emission intensity from the etched film ($SiO_2$ film) is weak because the wafer has the low aperture rate. In addition, the response variable of the over etching state doesn't reach "3". The reason can be thought that error is generated in applying the emission intensities during the etching process to the wafer W having the resist layer R of the low aperture rate to the multiple-regression model expression (1) obtained by using the sample wafer (a wafer having a solid oxide film). Thus, if a wafer used for obtaining the multiple-regression model expression has the same structure as that of a real wafer whose process end point is to be detected, the process end point can be detected more clearly.

As described above, according to the embodiment, the values of "1" and "3" are respectively set as different response variables to the two states before and after the etching state changes, a multiple regression analysis whose predictor variables are the emission intensities (detected data) of the plurality of component wavelengths of the emission spectrum is conducted by using the response variables "1" and "3" to produce the multiple regression model expression (1), the detected data when the wafer W is actually etched are applied in turn to the multiple regression model expression (1), and the process is monitored based on the result. Thus, even when a wafer having a low aperture rate is etched, the response variable sharply changes by means of a change of the plasma emission intensities, so that the end point of the etching process can be surely detected.

In the above embodiment, an etching process to a wafer is explained. However, this invention is not limited to the etching process by a plasma processing unit. This invention can be applied to various processes, for detecting a change from a state to another state.

The invention claimed is:

1. A plasma processing unit for conducting a predetermined etching process to an object to be processed, the processing unit comprising:
    a plurality of detectors; and
    a controlling unit that estimates or monitors a processing state based on a plurality of detected data from the plurality of detectors,
    wherein the controlling unit includes:
    a first storage unit that stores the plurality of detected data;
    a second storage unit that stores constant response variables respectively set for two states before and after the processing state changes, the response variables being different from each other, the two states being a state while the etching process is in progress and a state after completion of the etching process;
    a third storage unit that stores a multivariate analysis program, according to which a multiple regression analysis using a PLS method about the response variables is conducted in order to produce a model expression, predictor variables of the multiple regression analysis being the plurality of detected data;
    a first computing unit that executes the multivariate analysis program to produce the model expression;
    a fourth storage unit that stores the produced model expression; and
    a second computing unit that applies the plurality of detected data to the model expression in order to estimate or monitor the processing state, the plurality of detected data being detected when the predetermined etching process is conducted to the object to be processed,
    wherein the plasma processing unit is adapted to estimate or monitor a change of the processing state from the ongoing (in-progress) state of the etching process to the completion of the etching process based on response variables obtained by applying the plurality of detected data to the model expression.

2. A processing unit according to claim 1, wherein the plurality of detectors are optical detectors that detect emission intensities of a plurality of component wavelengths of plasma.

* * * * *